(12) United States Patent
Kim

(10) Patent No.: US 8,049,554 B2
(45) Date of Patent: Nov. 1, 2011

(54) INTEGRATED CIRCUIT

(75) Inventor: Jong-Hwan Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 38 days.

(21) Appl. No.: 12/627,284

(22) Filed: Nov. 30, 2009

(65) Prior Publication Data

US 2011/0001556 A1    Jan. 6, 2011

(30) Foreign Application Priority Data

Jul. 1, 2009  (KR) .................. 10-2009-0059793

(51) Int. Cl.
*G05F 1/10*    (2006.01)
(52) U.S. Cl. ..................................... 327/540
(58) Field of Classification Search ................ 327/143, 327/536, 537, 540, 541
See application file for complete search history.

(56) References Cited

U.S. PATENT DOCUMENTS 7,362,164 B2 *  4/2008  Kang ............................ 327/536
7,564,300 B2 *  7/2009  Lee ............................... 327/540
7,852,139 B2 * 12/2010  Hur ............................... 327/530

FOREIGN PATENT DOCUMENTS

KR    1020010064513    7/2001

OTHER PUBLICATIONS

Notice of Allowance issued from Korean Intellectual Property Office on Feb. 15, 2011.

* cited by examiner

*Primary Examiner* — Jeffrey Zweizig
(74) *Attorney, Agent, or Firm* — IP & T Group LLP

(57) ABSTRACT

An integrated circuit includes a first internal voltage generating unit configured to receive an external power and to generate a first internal voltage, and a second internal voltage generating unit configured to receive the first internal voltage, and to generate a second internal voltage having an absolute value of a target voltage level that is less than an absolute value of the first internal voltage, wherein the second internal voltage generating unit is initially enabled at a later time than the first internal voltage generating unit is initially enabled.

24 Claims, 6 Drawing Sheets

INTEGRATED CIRCUIT

CROSS-REFERENCE TO RELATED APPLICATIONS

The present application claims priority of Korean patent application number 10-2009-0059793, filed on Jul. 1, 2009, which is incorporated by reference in its entirety.

BACKGROUND OF THE INVENTION

Exemplary embodiments of the present invention relate to an integrated circuit, and more particularly, to an integrated circuit for generating an internal voltage.

An integrated circuit receives an external voltage, generates internal voltages having various voltage levels, and forms an internal circuit using these internal voltages.

FIG. 1 is a circuit diagram illustrating a conventional integrated circuit.

Referring to FIG. 1, the conventional integrated circuit includes a power-up signal generating unit 11, a first internal voltage generating unit 12 and a second internal voltage generating unit 13.

The power-up signal generating unit 11 generates a power-up signal PWRUP in response to a voltage level of a power supply voltage VDD provided by an external power supply. For reference, the power-up signal PWRUP is activated when the power supply voltage VDD exceeds a predetermined voltage level.

The first internal voltage generating unit 12 receives a ground voltage VSS and the power-up signal PWRUP, and generates a first internal voltage VINT1 in response to the power-up signal PWRUP. That is, when the power-up signal PWRUP is activated, the first internal voltage VINT1 is generated.

The first internal voltage generating unit 12 includes an internal voltage level detecting block 121, a periodic pulse generating block 122, and a charge pumping block 123.

The internal voltage level detecting block 121 detects whether the first internal voltage VINT1 is a target voltage, and outputs a voltage detection signal V_DET. The periodic pulse generating block 122 receives the voltage detection signal V_DET and the power-up signal PWRUP, and generates a periodic pulse signal OSC in response to the voltage detection signal V_DET and the power-up signal PWRUP. The charge pumping block 123 receives the periodic pulse signal OSC, and utilizes the ground voltage VSS to generate the first internal voltage VINT1 by performing a charge pumping operation in response to the periodic pulse signal OSC.

When the power-up signal PWRUP is activated, the periodic pulse generating block 122 outputs the periodic pulse signal OSC having a specific period, and the charge pumping block 123 generates the first internal voltage VINT1 using the periodic pulse signal OSC.

The second internal voltage generating unit 13 receives the first internal voltage VINT1 as a driving power and generates a second internal voltage VINT2 higher than the first internal voltage VINT1 in response to the power-up signal PWRUP.

Herein, the first internal voltage VINT1 is a negative voltage. Before the power-up signal PWRUP is activated, the ground voltage VSS is transferred to a first negative voltage terminal VBB through a first NMOS transistor MN1. After the power-up signal PWRUP is activated, the first internal voltage VINT1 is transferred to the first negative voltage terminal VBB.

Further, the second internal voltage VINT2 is a negative voltage. Before the power-up signal PWRUP is activated, the ground voltage VSS is transferred to a second negative voltage terminal VBBW through a second NMOS transistor MN2. After the power-up signal PWRUP is activated, the first internal voltage VINT1 is transferred to the second negative voltage terminal VBBW.

FIG. 2 is a graph illustrating a voltage change according to an internal operation of an integrated circuit shown in FIG. 1.

Referring to FIG. 2, before the power-up signal PWRUP is activated, the first negative voltage terminal VBB and the second negative voltage terminal VBBW maintain a ground voltage. After the power supply voltage VDD exceeds a predetermined voltage level, the power-up signal PWRUP is shifted to a low level voltage and is activated.

If the power-up signal PWRUP is activated, the first internal voltage generating unit 12 generates and transfers the first internal voltage VINT1 to the first negative voltage terminal VBB, and the second internal voltage generating unit 13 generates the second internal voltage VINT2 using the first internal voltage VINT1 and transfers the second internal voltage VINT2 to the second negative voltage terminal VBBW.

Meanwhile, the second internal voltage VINT2 is generated using the first internal voltage VINT1 as an operating power voltage. Accordingly, if a large amount of the second internal voltage VINT2 is consumed before the first internal voltage VINT1 is stabilized, the second internal voltage VINT2 increases up to a voltage level of a ground voltage VSS, and therefore, the first internal voltage VINT1 may also increase up to the voltage level of the ground voltage VSS. As described above, if an internal voltage is unstable, an internal circuit using the internal voltage may malfunction.

SUMMARY OF THE INVENTION

An embodiment of the present invention is directed to an integrated circuit for generating a stable internal voltage.

In accordance with an embodiment of the present invention, an integrated circuit includes a first internal voltage generating unit configured to receive an external power and to generate a first internal voltage, and a second internal voltage generating unit configured to receive the first internal voltage, and to generate a second internal voltage having an absolute value of a target voltage level that is less than an absolute value of the first internal voltage, wherein the second internal voltage generating unit is initially enabled at a later time than the first internal voltage generating unit is initially enabled.

The first internal voltage generating unit may be configured to be enabled and to generate the first internal voltage before a power-up signal is activated, and the second internal voltage generating unit may be configured to be enabled and to generate the second internal voltage after the power-up signal is activated.

The first internal voltage and the second internal voltage may be negative voltages.

The first internal voltage and the second internal voltage may be positive voltages.

The first internal voltage may be used as a bias voltage of a transistor.

The second internal voltage may be used as an inactivation control voltage of a transistor.

The first internal voltage generating unit may include an internal voltage level detecting block configured to detect whether the first internal voltage reaches a target voltage level, and to output a voltage detection signal a periodic pulse generating block configured to generate a periodic pulse signal in response to the voltage detection signal, and a charge pumping block configured to generate the first internal voltage using an external voltage by performing a charge pumping in response to the periodic pulse signal.

The second internal voltage generating unit includes a voltage regulator configured to receive the first internal voltage and to output the second internal voltage.

In accordance with another embodiment of the present invention, an integrated circuit includes a first power-up signal generating unit configured to generate a first power-up signal activated in response to a voltage level of a power supply voltage provided by an external voltage supply, a second power-up signal generating unit configured to generate a second power-up signal which is activated at a later time than the first power-up signal, a first internal voltage generating unit configured to receive an external power voltage and to generate the first internal voltage in response to the first power-up signal, and a second internal voltage generating unit configured to receive the first internal voltage as an operating power voltage, and to generate the second internal voltage having an absolute value of a target voltage level that is less than an absolute value of the first internal voltage in response to the second power-up signal.

The integrated circuit may further include a first switching unit configured to transfer the first internal voltage or the external power voltage to a first internal voltage terminal in response to the first power-up signal, and a second switching unit configured to transfer the second internal voltage or the external power voltage to a second internal voltage terminal in response to the second power-up signal.

The first internal voltage and the second internal voltage may be negative voltages.

The first internal voltage and the second internal voltage may be positive voltages.

The first internal voltage may be used as a bias voltage of a transistor.

The second internal voltage may be used as an inactivation control voltage of a transistor.

The first internal voltage generating unit includes an internal voltage level detecting block configured to detect whether the first internal voltage reaches a target voltage level, and to output a voltage detection signal, a periodic pulse generating block configured to generate a periodic pulse signal in response to the voltage detection signal and the first power-up signal, and a charge pumping block configured to generate the first internal voltage using an external voltage by performing a charge pumping in response to the periodic pulse signal.

The second internal voltage generating unit includes a voltage regulator configured to receive the first internal voltage and to output the second internal voltage in response to the second power-up signal.

In accordance with another embodiment of the present invention, an integrated circuit includes a first internal voltage generating unit configured to receive an external power voltage, and to generate a first internal voltage by performing a charge pumping before a power-up signal is activated, and a second internal voltage generating unit configured to receive the first internal voltage as an operating power voltage, and to generate a second internal voltage having an absolute value of a target voltage level that is less than an absolute value of the first internal voltage after the power-up signal is activated.

The integrated circuit may further include a switching unit configured to transfer the second internal voltage or the external power voltage to an internal voltage terminal in response to the power-up signal.

The integrated circuit may further include a power-up signal generating unit configured to generate the power-up signal, which is activated in response to a voltage level of a power supply voltage provided by an external power supply.

The first internal voltage and the second internal voltage may be negative voltages.

The first internal voltage and the second internal voltage may be positive voltages.

The first internal voltage may be used as a bias voltage of a transistor.

The second internal voltage may be used as an inactivation control voltage of a transistor.

The first internal voltage generating unit may include an internal voltage level detecting block configured to detect whether the first internal voltage reaches a target voltage level, and to output a voltage detection signal, a periodic pulse generating block configured to generate a periodic pulse signal in response to the voltage detection signal and the power-up signal, and a charge pumping block configured to generate the first internal voltage using an external voltage by performing a charge pumping in response to the periodic pulse signal.

The second internal voltage generating unit may include a voltage regulator configured to receive the first internal voltage and to output the second internal voltage in response to the power-up signal.

DESCRIPTION OF SPECIFIC EMBODIMENTS

Figure 1:
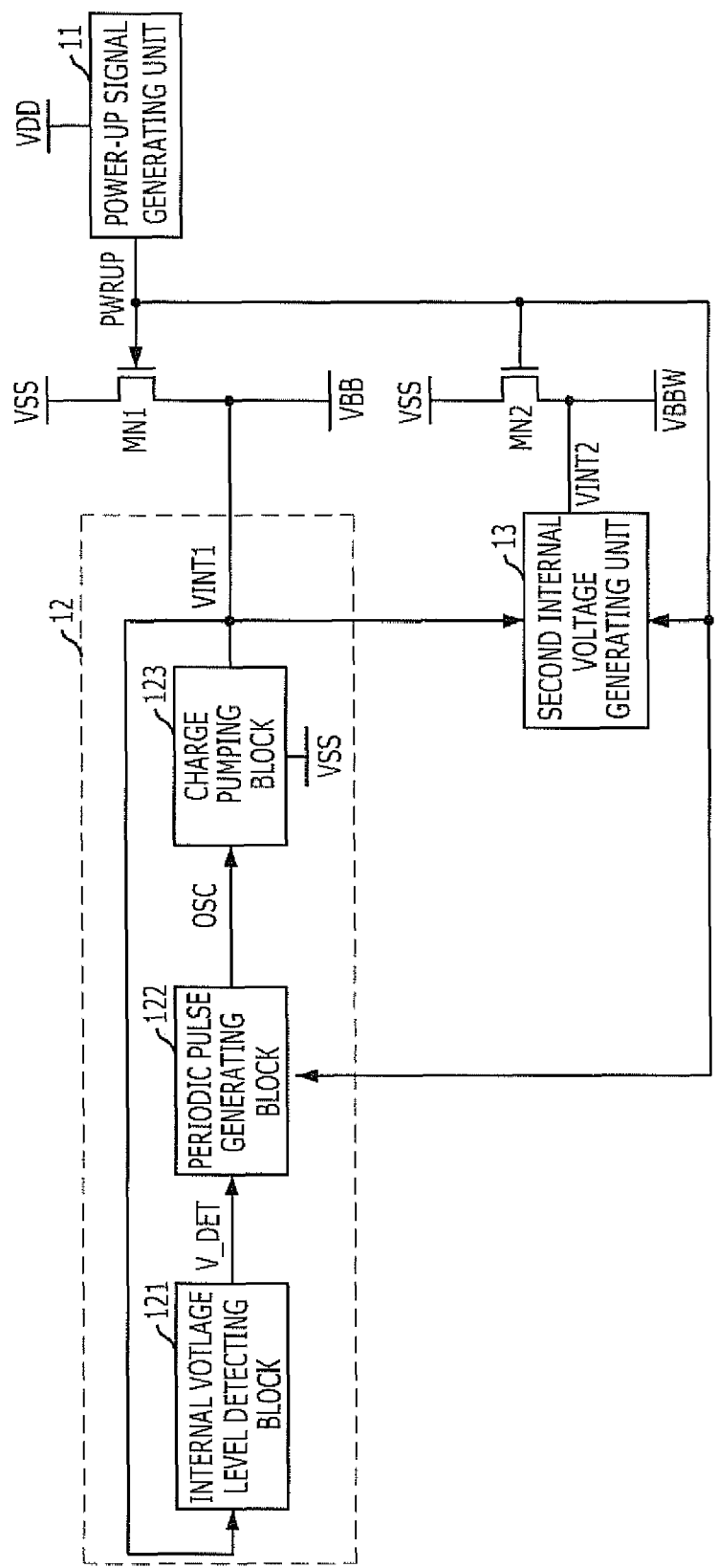
FIG. 1 is a circuit diagram illustrating a conventional integrated circuit.
Figure 2:
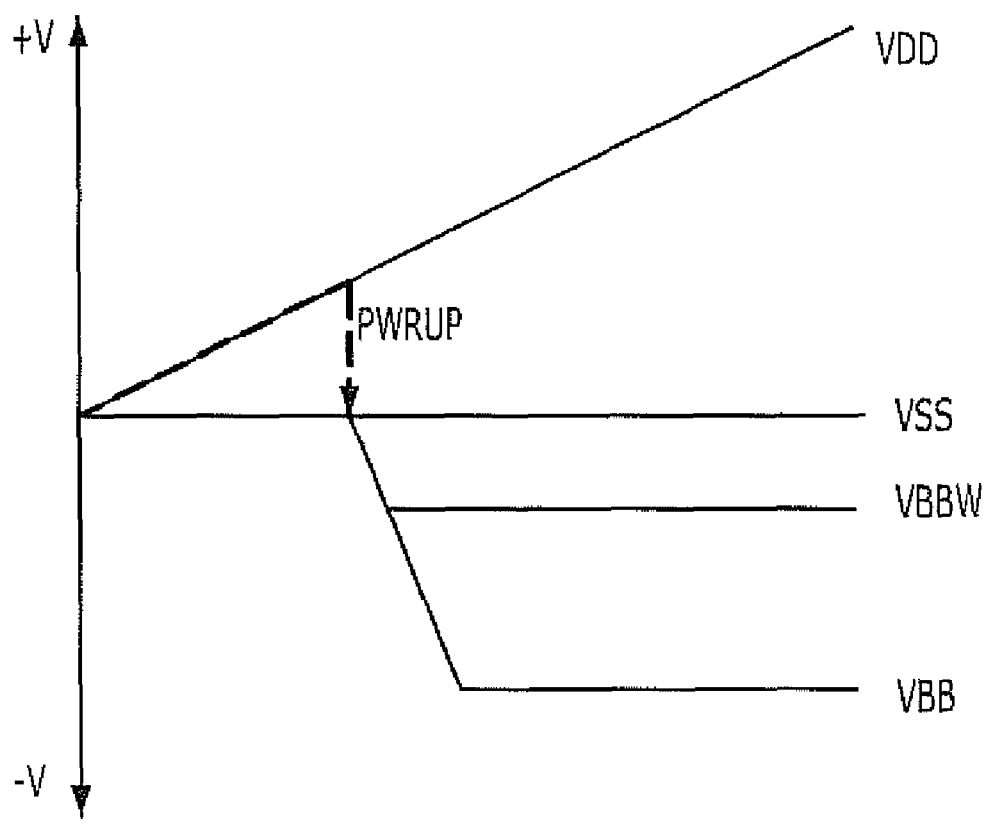
FIG. 2 is a graph illustrating a voltage change according to an internal operation of an integrated circuit shown in FIG. 1.

Exemplary embodiments of the present invention will be described below in more detail with reference to the accompanying drawings. The present invention may, however, be embodied in different forms and should not be construed as limited to the embodiments set forth herein. Rather, these embodiments are provided so that this application will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments.

Figure 3:
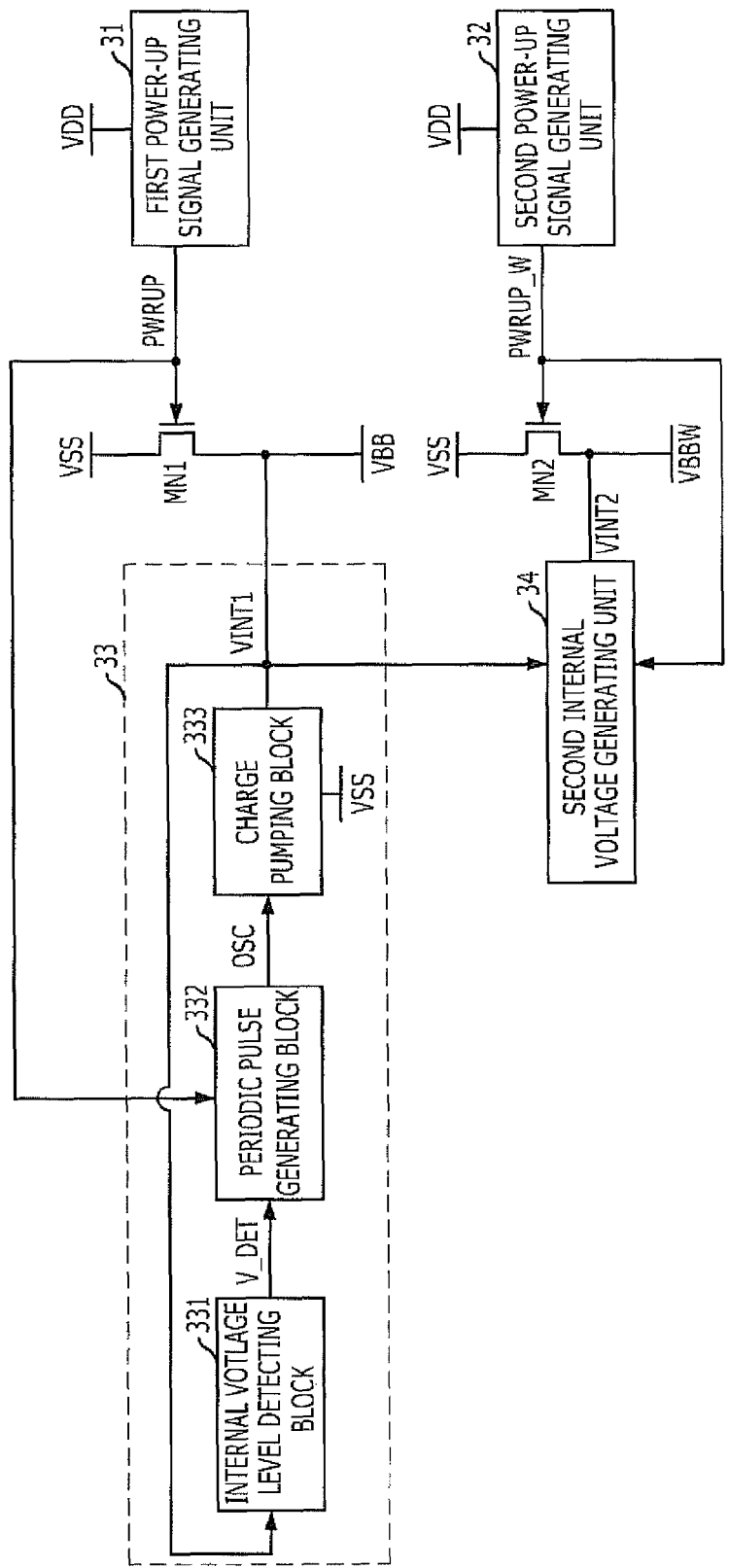
FIG. 3 is a circuit diagram illustrating an integrated circuit in accordance with a first embodiment of the present invention.

FIG. 3 is a circuit diagram illustrating an integrated circuit in accordance with a first embodiment of the present invention.

As shown in FIG. 3, the integrated circuit in accordance with a first embodiment of the present invention includes a first power-up signal generating unit 31, a second power-up signal generating unit 32, a first internal voltage generating unit 33, and a second internal voltage generating unit 34.

The first power-up signal generating unit 31 generates a first power-up signal PWRUP which is activated in response to a voltage level of a power supply voltage VDD provided by an external power supply.

The second power-up signal generating unit 32 generates a second power-up signal PWRUP_W which is activated at a later time than the first power-up signal PWRUP.

The first internal voltage generating unit 33 receives a ground voltage VSS and the first power-up signal PWRUP, and generates a first internal voltage VINT1 in response to the first power-up signal PWRUP.

The first internal voltage generating unit 33 includes an internal voltage level detecting block 331, a periodic pulse generating block 332, and a charge pumping block 333.

The internal voltage level detecting block 331 receives the first internal voltage VINT1, detects whether the first internal voltage VINT1 reaches a predetermined voltage level, and outputs a voltage detecting signal V_DET.

The periodic pulse generating block 332 receives the voltage detecting signal V_DET and the first power-up signal PWRUP, and generates a periodic pulse signal OSC in response to the first power-up signal PWRUP and the voltage detecting signal V_DET.

The charge pumping block 333 receives the periodic pulse signal OSC, and utilizes the ground voltage VSS to generate the first internal voltage VINT1 by performing a charge pumping in response to the periodic pulse signal OSC.

The second internal voltage generating unit 34 receives the first internal voltage VINT1 as an operating power voltage and a second power-up signal PWRUP_W, and generates a second internal voltage VINT2 having an absolute value of a target voltage level that is less than an absolute value of the first internal voltage VINT1 in response to the second power-up signal PWRUP_W.

The second internal voltage generating unit 34 includes a voltage regulator for receiving the first internal voltage VINT1 and outputting the second internal voltage VINT2 in response to the second power-up signal PWRUP_W.

For reference, the integrated circuit in accordance with the first embodiment of the present invention may further include a first switching unit MN1 and a second switching unit MN2.

The first switching unit MN1 transfers the ground voltage VSS or the first internal voltage VINT1 to a first internal voltage terminal VBB in response to the first power-up signal PWRUP. The second switching unit MN2 transfers the ground voltage VSS or the second internal voltage VINT2 to a second internal voltage terminal VBBW in response to the second power-up signal PWRUP_W. Each of the first and second switching units MN1 and MN2 include an NMOS transistor.

It is assumed that the first internal voltage VINT1 and the second internal voltage VINT2 are negative voltages in the first embodiment of the present invention.

A detailed operation of the integrated circuit in accordance with the first embodiment of the present invention will be described below.

The first power-up signal generating unit 31 and the second power-up signal generating unit 32 generate the first power-up signal PWRUP and the second power-up signal PWRUP_W, respectively, which are activated in response to the power supply voltage VDD provided by an external power supply.

For reference, the first power-up signal PWRUP and the second power-up signal PWRUP_W are activated when the power supply voltage VDD exceeds a predetermined voltage level.

The first internal voltage generating unit 33 receives the ground voltage VSS and the first power-up signal PWRUP, and generates the first internal voltage VINT1 in response to the first power-up signal PWRUP. That is, the first internal voltage VINT1 is generated when the first power-up signal PWRUP is activated.

The second internal voltage generating unit 34 receives the first internal voltage VINT1 as an operating power voltage and a second power-up signal PWRUP_W, and generates a second internal voltage VINT2, having an absolute value of a target voltage level that is less than an absolute value of the first internal voltage VINT1, in response to the second power-up signal PWRUP_W.

Before the first power-up signal PWRUP is activated, the ground voltage VSS is transferred to the first internal voltage terminal VBB through the first NMOS transistor MN1. After the first power-up signal PWRUP is activated, the first internal voltage VINT1 is transferred to the first internal voltage terminal VBB.

Before the second power-up signal PWRUP_W is activated, the ground voltage VSS is transferred to the second internal voltage terminal VBBW through the second NMOS transistor MN2. After the second power-up signal PWRUP_W is activated, the second internal voltage VINT2 is transferred to the second internal voltage terminal VBBW.

Figure 4:
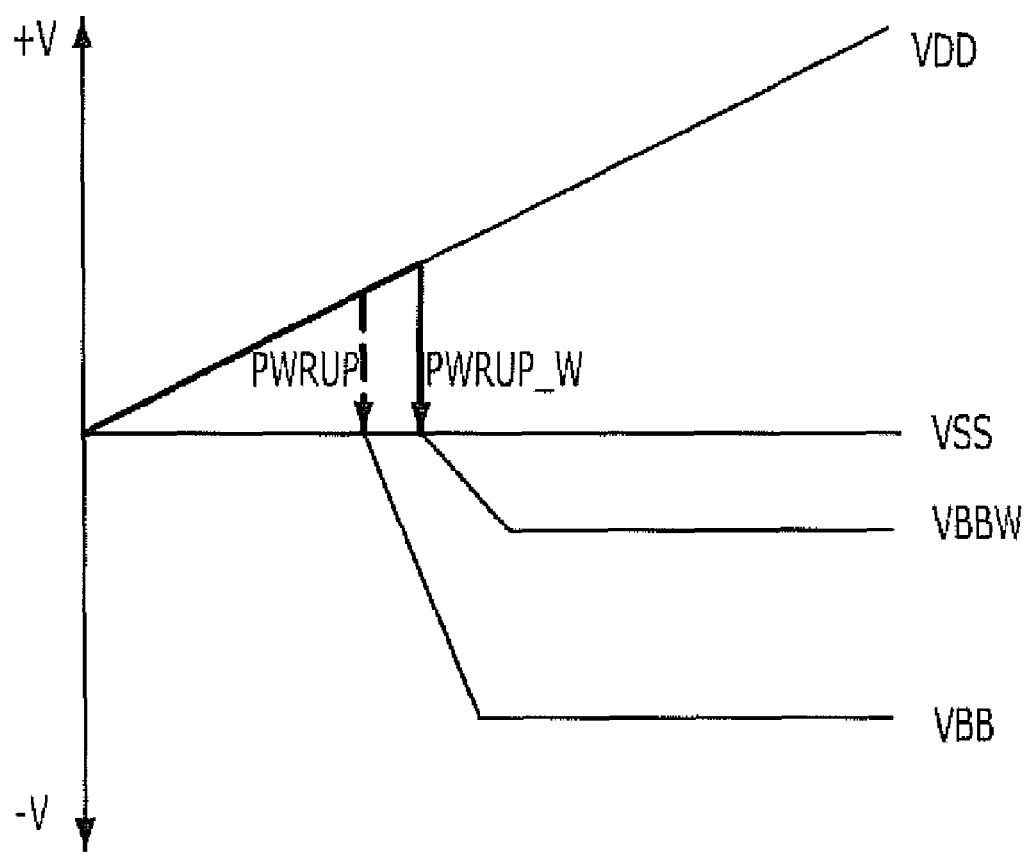
FIG. 4 is a graph illustrating a voltage change according to an internal operation of the integrated circuit shown in FIG. 3.

FIG. 4 is a graph illustrating a voltage change according to an internal operation of the integrated circuit shown in FIG. 3.

As shown in FIG. 4, before the first power-up signal PWRUP and the second power-up signal PWRUP_W are activated, the first internal voltage terminal VBB and the second internal voltage terminal VBBW maintain a ground voltage. If the power supply voltage VDD exceeds a predetermined voltage level, the first power-up signal PWRUP is shifted to a low level voltage and is activated. After the first power-up signal PWRUP is activated, the second power-up signal PWRUP_W is shifted to a low level voltage and is also activated.

If the first power-up signal PWRUP is activated, the first internal voltage generating unit 33 generates and transfers the first internal voltage VINT1 to the first internal voltage terminal VBB. If the second power-up signal PWRUP_W is activated, the second internal voltage generating unit 34 generates and transfers the second internal voltage VINT2 to the second internal voltage terminal VBBW using the first internal voltage VINT1.

Because the integrated circuit in accordance with the first embodiment of the present invention uses a voltage regulator scheme for generating the second internal voltage VINT2 using the first internal voltage VINT1, after the first internal voltage VINT1 is sufficiently stabilized, the stability of the internal voltage is improved. Accordingly, if the first internal voltage VINT1 and the second internal voltage VINT2 are used as a control voltage for deactivating a transistor and a bias voltage of a transistor, the leakage current of the transistor is decreased, thereby improving the operation stability of the transistor.

Figure 5:
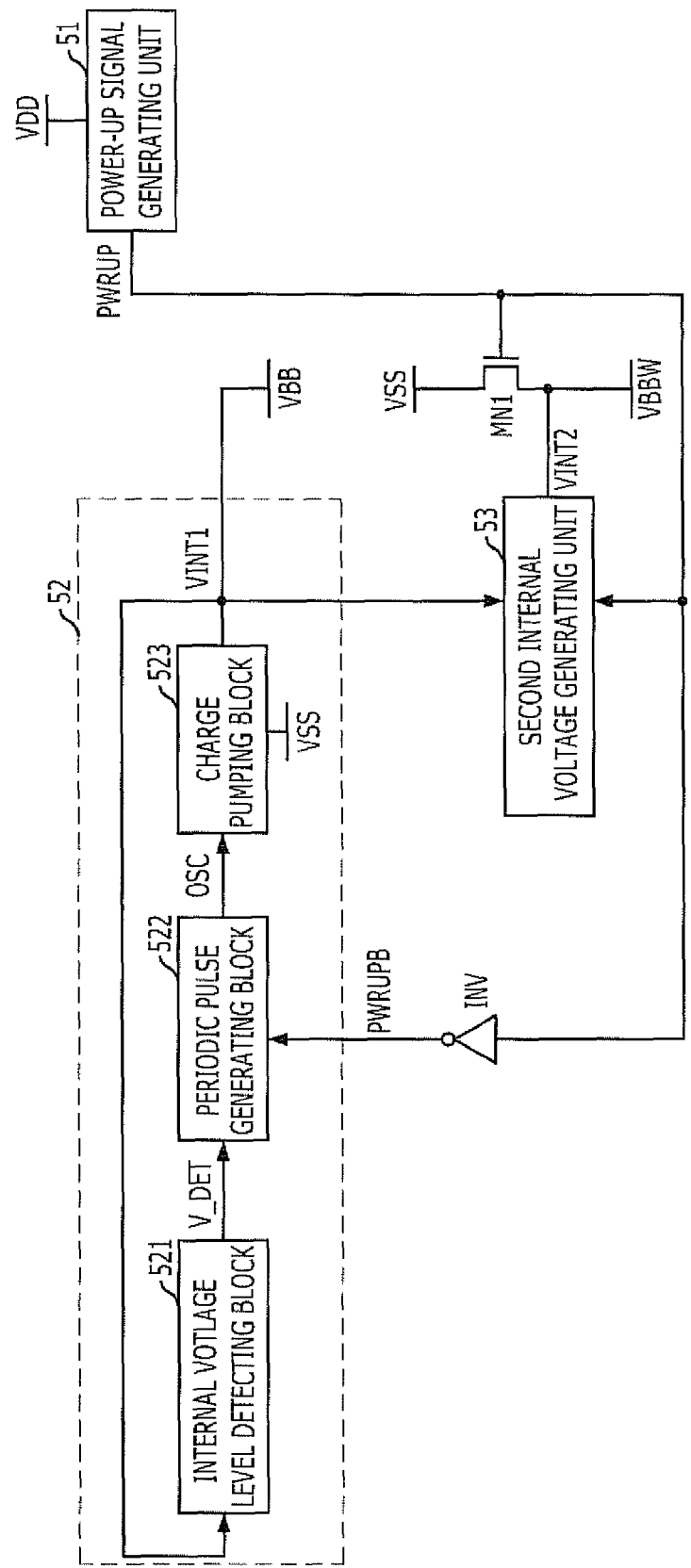
FIG. 5 is a circuit diagram illustrating an integrated circuit in accordance with a second embodiment of the present invention.

FIG. 5 is a circuit diagram illustrating an integrated circuit in accordance with a second embodiment of the present invention.

As shown in FIG. 5, the integrated circuit in accordance with the second embodiment of the present invention includes a first internal voltage generating unit 52 and a second internal voltage generating unit 53.

The first internal voltage generating unit 52 receives a ground voltage VSS and generates a first internal voltage VINT1 by performing a charge pumping before the power-up signal PWRUP is activated.

The first internal voltage generating unit 52 includes an internal voltage level detecting block 521, a periodic pulse generating block 522, and a charge pumping block 523.

The internal voltage level detecting block 521 receives the first internal voltage VINT1, detects whether the first internal voltage VINT1 reaches a target voltage level, and outputs a voltage detecting signal V_DET.

The periodic pulse generating block 522 generates a periodic pulse signal OSC in response to an inverted power-up signal PWRUPB (which is generated by an inverter INV configured to invert the power-up signal PWRUP) and the voltage detecting signal V_DET. The periodic pulse generating block 522 outputs the periodic pulse signal OSC having a specific period before the power-up signal PWRUP is activated.

The charge pumping block 523 generates the first internal voltage VINT1 by performing the charge pumping in response to the periodic pulse signal OSC.

The second internal voltage generating unit 53 receives the first internal voltage VINT1 as an operating power voltage and generates a second internal voltage VINT2, having an absolute value of a target voltage that is less than that of an absolute value of the first internal voltage VINT1, after the power-up signal PWRUP is activated.

The second internal voltage generating unit 53 includes a voltage regulator for receiving the first internal voltage VINT1 and outputting the second internal voltage VINT2 in response to the power-up signal PWRUP.

For reference, the integrated circuit in accordance with the second embodiment of the present invention may further include a switching unit MN1 and a power-up signal generating unit 51.

The switching unit MN1 transfers the second internal voltage VINT2 or the ground voltage VSS to an internal voltage terminal VBBW in response to the power-up signal PWRUP. The switching unit MN1 includes an NMOS transistor.

The power-up signal generating unit 51 generates the power-up signal PWRUP that is activated in response to a voltage level of the power supply voltage provided by an external power supply.

It is assumed that the first internal voltage VINT1 and the second internal voltage VINT2 are negative voltages.

Hereinafter, the operation of the integrated circuit will be described in more detail.

The power-up signal generating unit 51 generates the power-up signal PWRUP that is activated in response to a voltage level of a power supply voltage VDD provided by an external power supply. The power-up signal PWRUP is activated when the power supply voltage VDD exceeds a predetermined voltage level.

The first internal voltage generating unit 52 receives the ground voltage VSS, and generates the first internal voltage VINT1 by performing a charge pumping before the power-up signal PWRUP is activated.

The second internal voltage generating unit 53 receives the first internal voltage VINT1 as an operating power voltage, and generates the second internal voltage VINT2, having a voltage level higher than the first internal voltage VINT1, after the power-up signal PWRUP is activated.

The first internal voltage VINT1 is transferred to the first internal terminal VBB. Because the first internal voltage VINT1 is generated before the power-up signal PWRUP is activated, a voltage level of the first internal voltage terminal VBB decreases and reaches a target voltage level, before the power-up signal PWRUP is activated.

The second internal voltage VINT2 is transferred to a second internal voltage terminal VBBW. Before the power-up signal PWRUP is activated, the ground voltage VSS is transferred to the second internal voltage terminal VBBW through the switching unit MN1. After the power-up signal PWRUP is activated, the second internal voltage VINT2 is transferred to the second internal voltage terminal VBBW.

Figure 6:
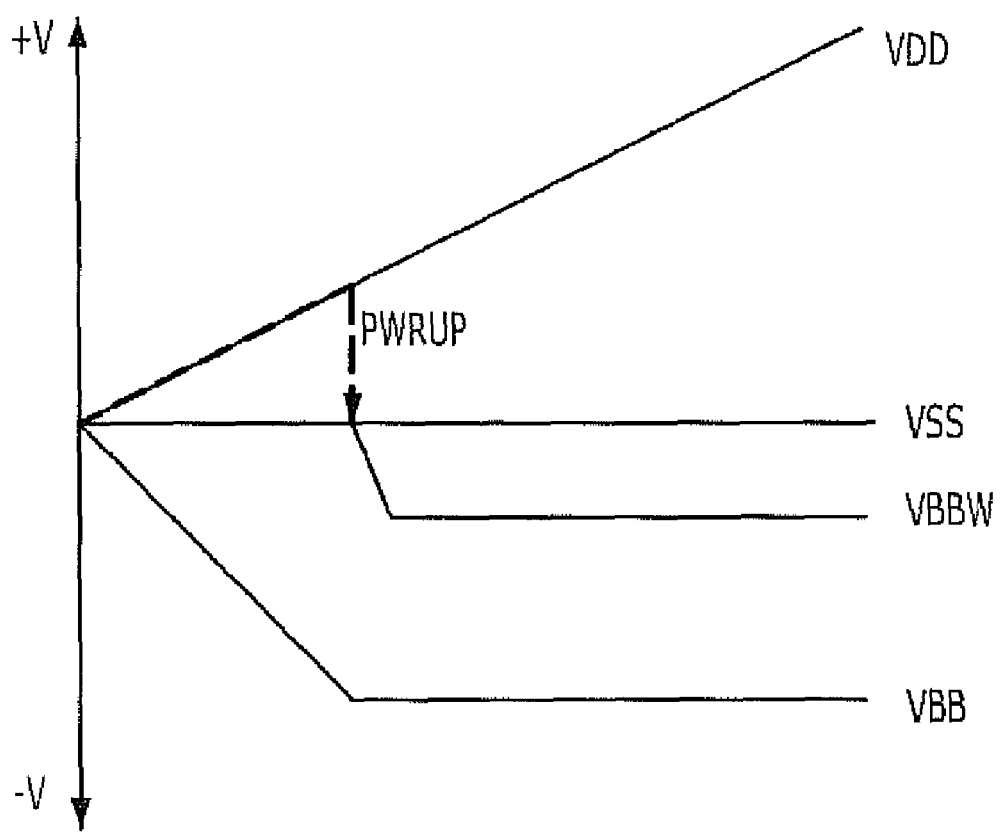
FIG. 6 is a graph illustrating a voltage change according to an internal operation of the integrated circuit shown in FIG. 5.

FIG. 6 is a graph illustrating a voltage change according to an internal operation of the integrated circuit shown in FIG. 5.

As shown in FIG. 6, before the power-up signal PWRUP is activated, the second internal voltage terminal VBBW maintains the ground voltage VSS, and the first internal voltage terminal VBB starts to decrease to a target voltage level. Then, when the power supply voltage VDD exceeds a predetermined voltage level, the power-up signal PWRUP is shifted to a low level voltage and is activated. If the power-up signal PWRUP is activated, the second internal voltage generating unit 53 generates the second internal voltage VINT2 using the first internal voltage VINT1 and transfers the second internal voltage VINT2 to the second internal voltage terminal VBBW.

Because the integrated circuit in accordance with the second embodiment of the present invention uses a voltage regulator scheme for generating the second internal voltage VINT2 using the first internal voltage VINT1, after the first internal voltage VINT1 is sufficiently stabilized, the stability of the internal voltage is improved. Accordingly, if the first internal voltage VINT1 and the second internal voltage VINT2 are used as a control voltage for deactivating a transistor and a bias voltage of a transistor, the leakage current of the transistor is decreased, thereby improving the operation stability of the transistor.

As described above, because the second internal voltage VINT2 is generated using the first internal voltage VINT1 after the first internal voltage is sufficiently stabilized, even though the second internal voltage VINT2 is largely consumed in an initializing process of the first internal voltage VINT1, the voltage change of the second internal voltage VINT2 is sufficiently controlled.

The integrated circuit of an embodiment of the present invention improves the stability of an internal voltage by using a voltage regulator scheme for generating a second internal voltage using a first internal voltage after the first internal voltage is fully stabilized.

Accordingly, if the first internal voltage and the second internal voltage are used as a bias voltage of a transistor and an inactivation control voltage of the transistor, a leakage current is decreased and an operation stability of the transistor is improved.

While the present invention has been described with respect to the specific embodiments, it will be apparent to those skilled in the art that various changes and modifications may be made without departing from the spirit and scope of the invention as defined in the following claims.

For example, an active high level or an active low level corresponding to the activation state of a signal or a circuit may be used interchangeably in accordance with additional embodiments of the present invention.

Moreover, the configuration of a transistor may be changed to implement the same operation. That is, a PMOS transistor may substitute for an NMOS transistor. Likewise, the configuration of a logic gate may be changed to perform the same function.

What is claimed is:
1. An integrated circuit, comprising:
a first internal voltage generating unit configured to receive an external power and to generate a first internal voltage; and
a second internal voltage generating unit configured to receive the first internal voltage, and to generate a second internal voltage having an absolute value of a target voltage level that is less than an absolute value of the first internal voltage, wherein the second internal voltage generating unit is initially enabled at a later time than the first internal voltage generating unit is initially enabled, and wherein the first internal voltage generating unit is configured to be enabled and to generate the first internal voltage before a power-up signal is activated, and the second internal voltage generating unit is configured to be enabled and to generate the second internal voltage after the power-up signal is activated.

2. The integrated circuit of claim 1, wherein the first internal voltage and the second internal voltage are negative voltages.

3. The integrated circuit of claim 1, wherein the first internal voltage and the second internal voltage are positive voltages.

4. The integrated circuit of claim 2, wherein the first internal voltage is used as a bias voltage of a transistor.

5. The integrated circuit of claim 2, wherein the second internal voltage is used as an inactivation control voltage of a transistor.

6. The integrated circuit of claim 1, wherein the first internal voltage generating unit comprises:
an internal voltage level detecting block configured to detect whether the first internal voltage reaches a target voltage level, and to output a voltage detection signal;
a periodic pulse generating block configured to generate a periodic pulse signal in response to the voltage detection signal; and
a charge pumping block configured to generate the first internal voltage using an external voltage by performing a charge pumping in response to the periodic pulse signal.

7. The integrated circuit of claim 1, wherein the second internal voltage generating unit comprises:
a voltage regulator configured to receive the first internal voltage and to output the second internal voltage.

8. An integrated circuit, comprising:
a first power-up signal generating unit configured to generate a first power-up signal activated in response to a voltage level of a power supply voltage provided by an external voltage supply;
a second power-up signal generating unit configured to generate a second power-up signal which is activated at a later time than the first power-up signal;
a first internal voltage generating unit configured to receive an external power voltage and to generate the first internal voltage in response to the first power-up signal; and
a second internal voltage generating unit configured to receive the first internal voltage as an operating power voltage, and to generate the second internal voltage having an absolute value of a target voltage level that is less than an absolute value of the first internal voltage in response to the second power-up signal.

9. The integrated circuit of claim 8, further comprising:
a first switching unit configured to transfer the first internal voltage or the external power voltage to a first internal voltage terminal in response to the first power-up signal; and
a second switching unit configured to transfer the second internal voltage or the external power voltage to a second internal voltage terminal in response to the second power-up signal.

10. The integrated circuit of claim 8, wherein the first internal voltage and the second internal voltage are negative voltages.

11. The integrated circuit of claim 8, wherein the first internal voltage and the second internal voltage are positive voltages.

12. The integrated circuit of claim 8, wherein the first internal voltage is used as a bias voltage of a transistor.

13. The integrated circuit of claim 8, wherein the second internal voltage is used as an inactivation control voltage of a transistor.

14. The integrated circuit of claim 8, wherein the first internal voltage generating unit comprises:
an internal voltage level detecting block configured to detect whether the first internal voltage reaches a target voltage level, and to output a voltage detection signal;
a periodic pulse generating block configured to generate a periodic pulse signal in response to the voltage detection signal and the first power-up signal; and
a charge pumping block configured to generate the first internal voltage using an external voltage by performing a charge pumping in response to the periodic pulse signal.

15. The integrated circuit of claim 8, wherein the second internal voltage generating unit comprises:
a voltage regulator configured to receive the first internal voltage and to output the second internal voltage in response to the second power-up signal.

16. An integrated circuit, comprising:
a first internal voltage generating unit configured to receive an external power voltage, and to generate a first internal voltage by performing a charge pumping before a power-up signal is activated; and
a second internal voltage generating unit configured to receive the first internal voltage as an operating power voltage, and to generate a second internal voltage having an absolute value of a target voltage level that is less than an absolute value of the first internal voltage after the power-up signal is activated.

17. The integrated circuit of claim 16, further comprising:
a switching unit configured to transfer the second internal voltage or the external power voltage to an internal voltage terminal in response to the power-up signal.

18. The integrated circuit of claim 16, further comprising:
a power-up signal generating unit configured to generate the power-up signal, which is activated in response to a voltage level of a power supply voltage provided by an external power supply.

19. The integrated circuit of claim 16, wherein the first internal voltage and the second internal voltage are negative voltages.

20. The integrated circuit of claim 16, wherein the first internal voltage and the second internal voltage are positive voltages.

21. The integrated circuit of claim 16, wherein the first internal voltage is used as a bias voltage of a transistor.

22. The integrated circuit of claim 16, wherein the second internal voltage is used as an inactivation control voltage of a transistor.

23. The integrated circuit of claim 16, wherein the first internal voltage generating unit comprises:
an internal voltage level detecting block configured to detect whether the first internal voltage reaches a target voltage level, and to output a voltage detection signal;
a periodic pulse generating block configured to generate a periodic pulse signal in response to the voltage detection signal and the power-up signal; and
a charge pumping block configured to generate the first internal voltage using an external voltage by performing a charge pumping in response to the periodic pulse signal.

24. The integrated circuit of claim 16, wherein the second internal voltage generating unit comprises:
a voltage regulator configured to receive the first internal voltage and to output the second internal voltage in response to the power-up signal.

* * * * *